(12) United States Patent
Ooishi

(10) Patent No.: US 6,992,935 B2
(45) Date of Patent: Jan. 31, 2006

(54) NONVOLATILE MEMORY DEVICE EFFICIENTLY CHANGING FUNCTIONS OF FIELD PROGRAMMABLE GATE ARRAY AT HIGH SPEED

(75) Inventor: Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/461,417

(22) Filed: Jun. 16, 2003

(65) Prior Publication Data

US 2004/0125660 A1    Jul. 1, 2004

(30) Foreign Application Priority Data

Dec. 26, 2002    (JP) ............................. 2002-377151

(51) Int. Cl.
*G11C 11/14*    (2006.01)
*G11C 11/15*    (2006.01)
*G11C 7/06*    (2006.01)

(52) U.S. Cl. ................. 365/189.05; 365/158; 365/209; 365/205

(58) Field of Classification Search ................ 365/158, 365/156, 205, 209, 189.05; 326/37
See application file for complete search history.

(56) References Cited

U.S. PATENT DOCUMENTS

| 6,304,477 | B1 | 10/2001 | Naji |
| 6,317,359 | B1 | 11/2001 | Black et al. |
| 6,324,093 | B1 | 11/2001 | Perner et al. |
| 6,349,054 | B1 * | 2/2002 | Hidaka ...................... 365/173 |
| 6,480,954 | B2 * | 11/2002 | Trimberger et al. ........... 713/1 |
| 2003/0122578 | A1 * | 7/2003 | Masui et al. .................. 326/39 |

FOREIGN PATENT DOCUMENTS

| JP | 2001-298357 | 10/2001 |
| JP | 2002-511631 | 4/2002 |
| WO | WO99/53499 | 10/1999 |

* cited by examiner

*Primary Examiner*—Richard Elms
*Assistant Examiner*—J. H. Hur
(74) *Attorney, Agent, or Firm*—McDermott Will & Emery LLP

(57) ABSTRACT

A switch section for changing the function of an FPGA is provided with a data latch circuit used for connection control. The data latch circuit includes program sections in which program data is stored in advance, and latch unit. At the time of changing the function, control signals are selectively inputted, whereby latch unit and program section are electrically coupled to each other, and a data signal stored in program section is outputted from the data latch circuit. With this arrangement, it is possible to easily change the function of an FPGA without rewriting program data.

2 Claims, 15 Drawing Sheets

COLUMN DIRECTION ↑
→ ROW DIRECTION

NONVOLATILE MEMORY DEVICE EFFICIENTLY CHANGING FUNCTIONS OF FIELD PROGRAMMABLE GATE ARRAY AT HIGH SPEED

BACKGROUND OF THE INVENTION

1. Field of the Invention

The present invention relates to a nonvolatile memory device, and more particularly to a nonvolatile memory device including a data latch circuit which latches program information to output the latched information.

2. Description of the Background Art

In recent years, attention has been paid to an FPGA (Field Programmable Gate Array) as a rewritable large-scale integrated circuit.

An FPGA is a semiconductor device capable of changing its functions later on, so as to perform predetermined operations by providing external data and the like to an internal circuit.

The FPGA is used as a prototype for devices because of its feature in that the time of development is shorter than that of a gate array, and has been used these years as a prototype device for a cellular phone or an ETC (Electronic Toll Collection system).

A FPGA is generally provided with: a plurality of logical blocks; a plurality of switch circuits for switching the connection relationship (signal paths) of the plurality of logical blocks; and a control circuit for controlling the plurality of switch circuits. The control circuit latches program information programmed in a predetermined region to selectively supply the latched information to the switch circuit in order to control the switch circuits. This results in the switching of the connection relationship (signal paths) between the plurality of logical blocks to change the functions of the FPGA.

Various kinds of latch circuits have been proposed as a circuit for latching program information. Conventionally, there has been used a configuration of storing program information into a so-called SRAM (Static Randam Access Memory) element while performing switching control by using a data latch circuit for latching the stored data.

However, in the data latch circuits employing an SRAM element which is a volatile element, latched program information is lost after the power supply is suspended. This makes it necessary to temporarily download the program information to be latched in the data latch circuit, every time power is turned on, which might interfere with high-speed operations.

Japanese National Patent Publication No. 2002-511631 proposes a data latch circuit capable of latching storage data to output the latched storage data by using a nonvolatile element, without downloading the program data when power is turned on.

However, an FPGA is required to change various functions by performing various patterns of switching control, and the changing of functions requires rewriting program information that has been temporarily stored in the data latch circuit.

It is therefore difficult to efficiently change the functions of an FPGA at high speed.

SUMMARY OF THE INVENTION

An object of the present invention is to solve the above-described problems and to provide a nonvolatile memory device capable of efficiently changing the functions of an FPGA at high speed.

A nonvolatile memory device according to the present invention includes a plurality of program sections and a latch circuit. Each of the plurality of program sections receives data writing currents according to program data used for a peripheral circuit to perform nonvolatile data storage. The latch circuit holds a data signal generated by a selected program section among the plurality of program sections at the time of data reading.

As described above, the latch circuit holds and outputs a data signal of a selected program section among a plurality of program sections. This eliminates the need for the rewriting of data to be latched, thereby enabling a data signal used in a peripheral circuit to be outputted efficiently.

The nonvolatile memory device includes a plurality of switch sections and a plurality of switch control sections. The plurality of switch sections set signal transmission paths between a plurality of circuit blocks. The plurality of switch control sections are disposed in correspondence with the plurality of switch sections, respectively, and each thereof controls the corresponding switch sections. Each of the plurality of switch control sections includes a plurality of program sections and a latch circuit. Each of the plurality of program sections receives data writing currents according to program data used in setting of the signal transmission paths to perform nonvolatile data storage. The latch circuit holds a data signal generated by a selected program section among the plurality of program sections at the time of data reading.

In the nonvolatile memory device, each of the switch control sections includes a plurality of program sections and a latch circuit. The latch circuit holds a data signal from a selected program section among the plurality of program sections. This eliminates the need for the rewriting of data in the program section in order to set a signal transmission path, thereby enabling the setting of a signal transmission path efficiently by using the selected program section among the plurality of program sections.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a conceptual diagram for describing a data reading operation in which program data held in the program section is automatically read to latch the read data in the data latch circuit when power is turned on;

DESCRIPTION OF THE PREFERRED EMBODIMENTS

Hereinafter, embodiments of the present invention will be described in detail with reference to the drawings. The same or corresponding components in the figures are denoted with the same symbols; therefore, the description thereof will not be repeated.

First Embodiment

Figure 1:
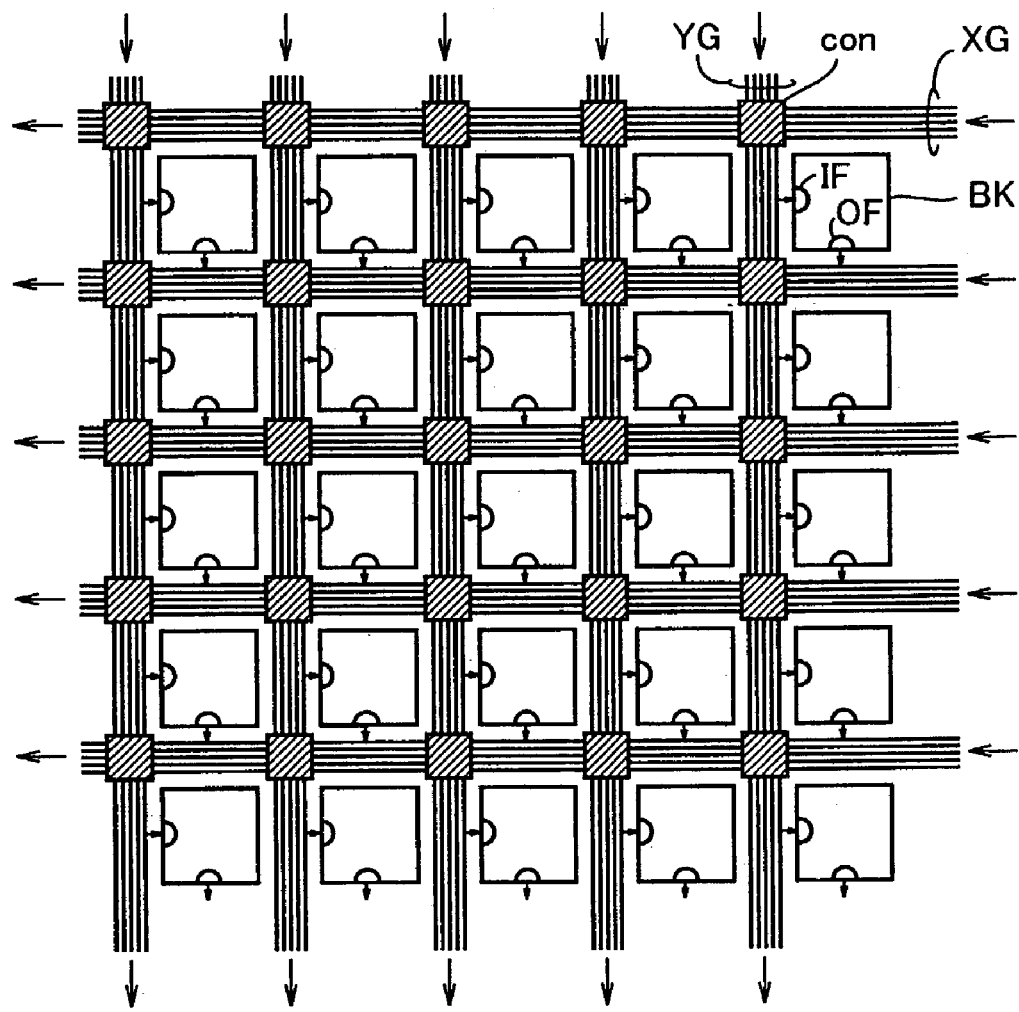
FIG. 1 is a schematic block diagram showing the entire configuration of an FPGA according to a first embodiment of the present invention.
Figure 1:
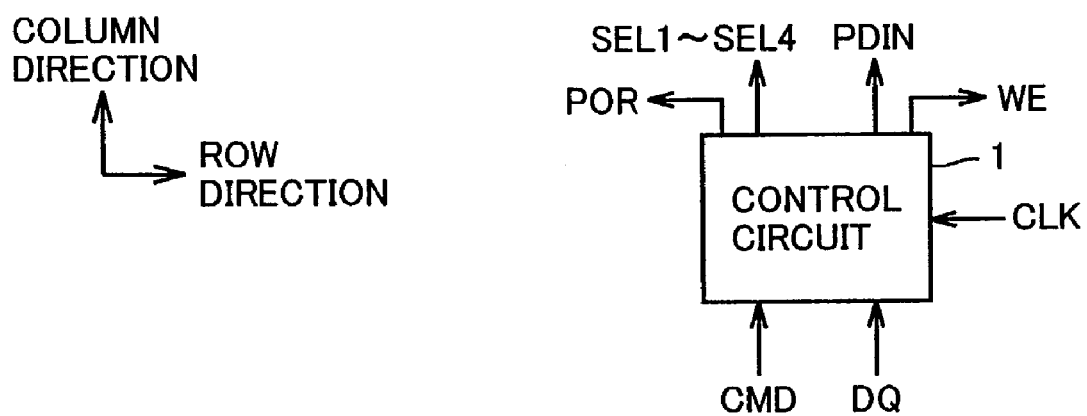

With reference to FIG. 1, an FPGA according to a first embodiment of the present invention includes a plurality of logical blocks BK arranged in a matrix, and writing regions are arranged between these blocks. The writing regions are provided with a plurality of horizontal writing groups XG in the row direction and a plurality of vertical writing groups YG in the column direction.

Each of logical blocks BK includes an input interface section IF which receives a data signal from adjacent vertical writing groups YG, and an output interface section OF which outputs an output result obtained by the operation of each logical block to adjacent horizontal writing groups XG. The FPGA also includes switch sections CON for electrically connecting logical blocks BK and the writing regions to each other. The connection control of switch sections CON determines the connection relationship between logical blocks BK. A control circuit 1 for controlling the FPGA as a whole is disposed in a predetermined region. Control circuit 1 outputs control signals (POR, SEL1 to SEL4, WE), which will be described later, and the like for performing various operations in response to a command CMD indicative of data reading or data writing. Control circuit 1 operates as necessary in synchronization with a clock signal CLK to be inputted. Control circuit 1 also generates writing data PDIN in response to input data DQ.

As will be apparent in the following, in this embodiment, description will be only given of one data latch circuit, which will be described later, included in one switch section CON; however, the other switch sections and the other data latch circuits have the similar configuration and are controlled by control circuit 1.

Figure 2:
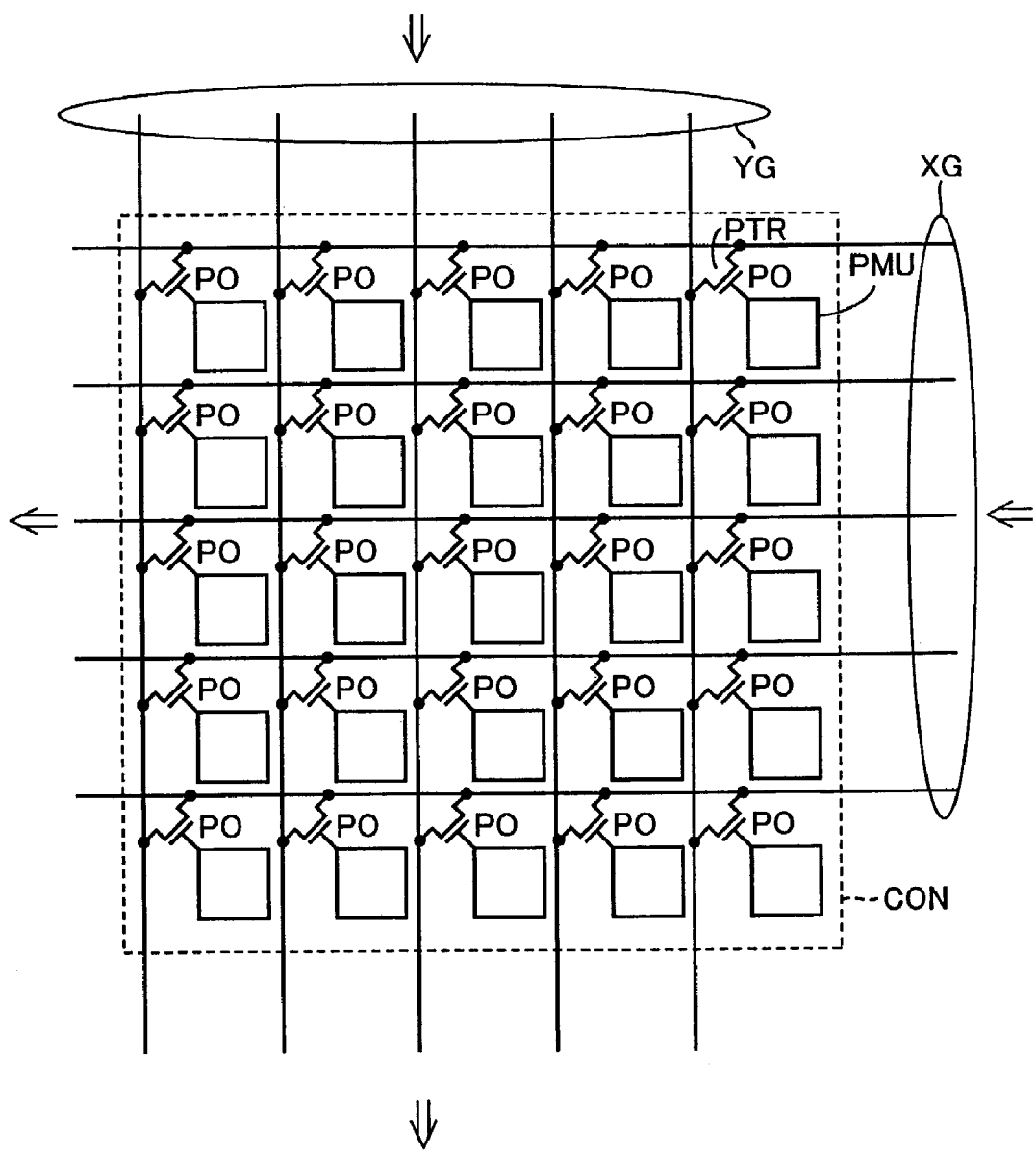
FIG. 2 is a conceptual diagram showing the configuration of a switch section.

With reference to FIG. 2, switch section CON includes: a plurality of transistors PTR arranged in a matrix; and a plurality of data latch circuits PMU disposed in correspondence with the plurality of transistors PTR, respectively. The writing regions arranged between the blocks are provided with vertical writings and horizontal writings, and signals from the horizontal writing are selectively transmitted to the vertical writing in response to the turning on of the transistors. Data latch circuits PMU are used for the connection control of transistors PTR performing the switching of the signal paths from the horizontal writing to the vertical writing.

Figure 3:
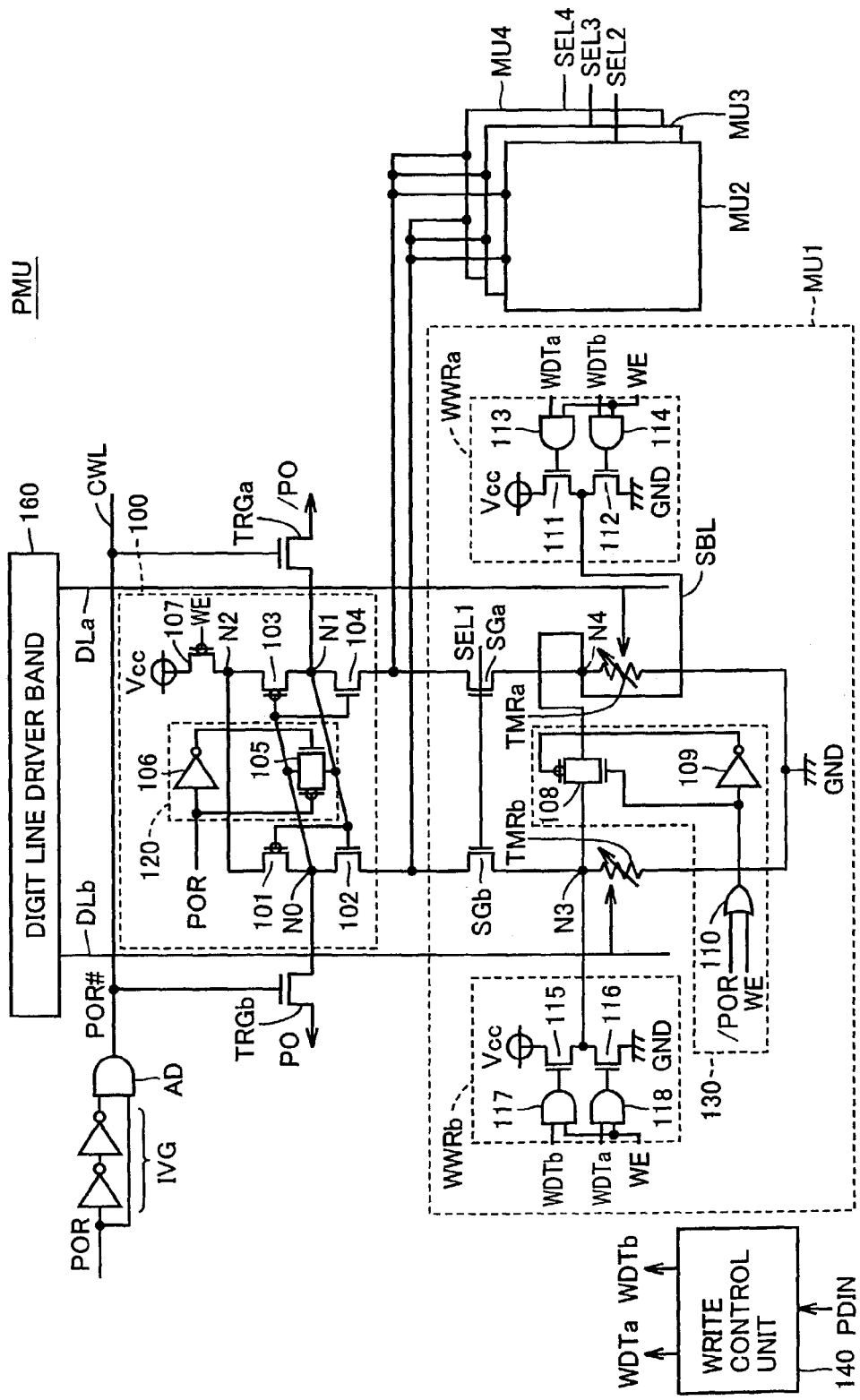
FIG. 3 is a circuit diagram showing the configuration of a data latch circuit according to the first embodiment.

With reference to FIG. 3, data latch circuit PMU according to the first embodiment of the present invention includes: program sections MU1 to MU4 each of which stores a plurality of pieces of program data constituting the program information transmitted to corresponding transistors PTR; and a latch unit 100 which latches program data selectively supplied from program sections MU1 to MU4 to transmit the latched data to corresponding transistors PTR.

Program sections MU1 to MU4 all have the same circuit configuration, so that program section MU1 will be described herein as a representative.

Program section MU1 includes: a bit line SBL for supplying a data writing current; bit line drivers WWRb and WWRa disposed in correspondence with one end side and the other end side of bit line SBL, respectively; a tunneling magneto-resistance element TMRb, which is a magnetic element memory device, provided at one end side of bit line SBL and disposed between a ground voltage GND and a connection node N3 of bit line SBL to store program data; a tunneling magneto-resistance element TMRa provided at the other end side of bit line SBL and disposed between ground voltage GND and a connection node N4 of bit line SBL to store program data; and digit lines DLa and DLb disposed in correspondence with tunneling magneto-resistance element TMRa and TMRb, respectively, and supplied with a data writing current at the time of data writing. Herein, bit line SBL is so disposed as to supply the data writing currents in the different directions with respect to tunneling magneto-resistance elements TMRa and TMRb. Tunneling magneto-resistance elements TMRa and TMRb will also be collectively referred to as tunneling magneto-resistance elements TMR.

Herein, description will be given of data writing utilizing tunneling magneto-resistance elements TMR.

Figure 4:
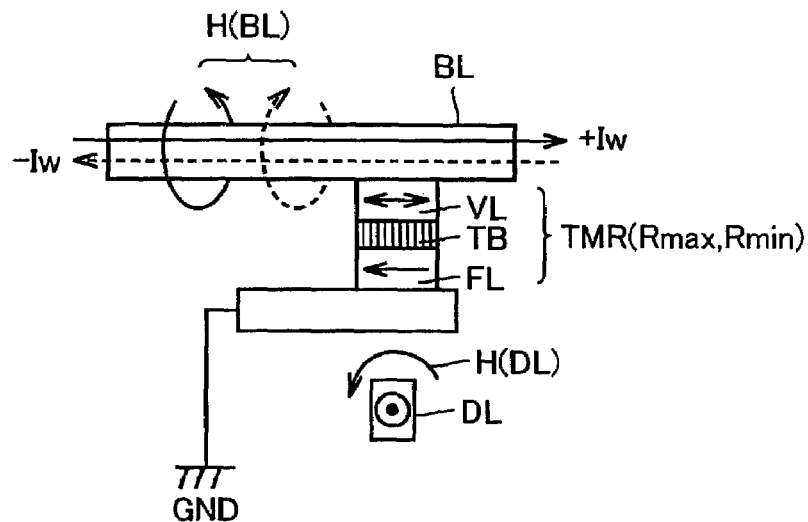
FIG. 4 is a conceptual diagram for describing a data writing operation for a tunneling magneto-resistance element.

With reference to FIG. 4, tunneling magneto-resistance element TMR includes: a ferromagnetic layer FL having a fixed predetermined magnetic direction (hereinafter, simply referred to as "fixed magnetic layer"); and a ferromagnetic layer VL magnetized in the direction according to the magnetic field applied from outside (hereinafter, simply referred to as "free magnetic layer"). A tunneling barrier (tunneling film) TB made of an insulating film is provided between fixed magnetic layer FL and free magnetic layer VL. Free magnetic layer VL is magnetized in the direction the same as or opposite to fixed magnetic layer FL according to the level of the storage data to be written. Fixed magnetic layer FL, tunneling barrier TB and free magnetic layer VL form a magnetic tunnel junction.

The electric resistance of tunneling magneto-resistance elements TMR is changed according to the correlation in the magnetic directions between fixed magnetic layer FL and free magnetic layer VL. To be more specific, the electric resistance of tunneling magneto-resistance elements TMR has a minimum value Rmin when fixed magnetizing layer FL and free magnetic layer VL are the same (parallel) in the magnetic direction, and has a maximum value Rmax when these layers are opposite in the magnetic direction.

At the time of data writing, the data writing current for magnetizing free magnetic layer VL is flown in the direction (±Iw) according to the level of the writing data in bit line BL. The data writing current also flows through digit line DL. A magnetic field H (BL) is generated in bit line BL on the basis of the flown data writing current. Also, a magnetic field H (DL) is generated in digit line DL.

Figure 5:
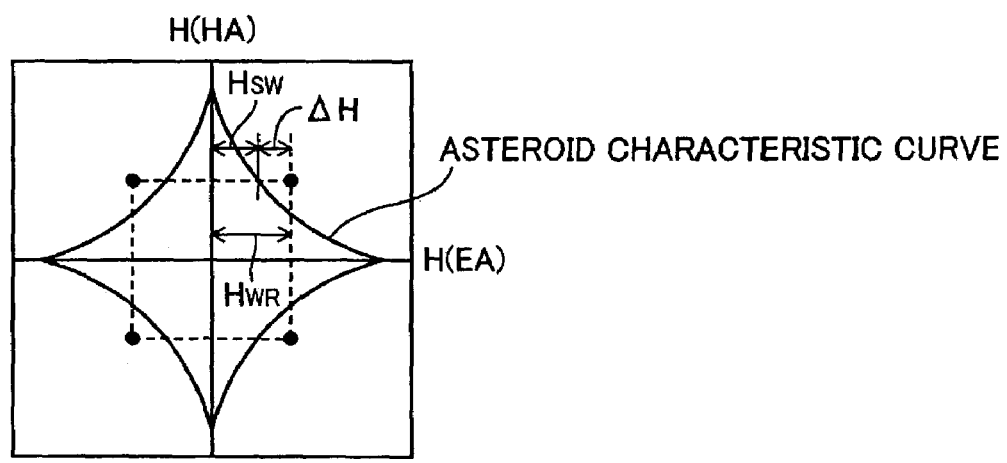
FIG. 5 is a conceptual diagram showing the relation between a data writing current and the magnetic direction of the tunneling magneto-resistance element at the time of data writing.

With reference to FIG. 5, description will be given of the relation between the data writing current and the magnetic direction of the tunneling magneto-resistance elements at the time of data writing.

A lateral axis H (EA) indicates the magnetic field to be applied in the direction of EA (Easy Axis) in free magnetic layer VL inside tunneling magneto-resistance elements TMR. On the other hand, a vertical axis H (HA) indicates the magnetic field which effects in the direction of HA (Hard Axis) in free magnetic layer VL. Magnetic fields H (EA) and H (HA) respectively correspond to the two magnetic fields generated by the electric currents flowing through bit line BL and digit line DL, respectively.

In tunneling magneto-resistance elements TMR, the fixed magnetic direction of fixed magnetic layer FL is along EA of free magnetic layer VL, and free magnetic layer VL is magnetized in the direction parallel or opposite to fixed magnetic layer FL in the direction of EA according to the level ("1" and "0") of storage data. Tunneling magneto-resistance elements TMR can store 1-bit data ("1" and "0") in correspondence with the two magnetic directions of free magnetic layer VL.

The magnetic direction of free magnetic layer VL can be updated only when the sum of magnetic fields H (EA) and H (HA) to be applied reaches the region outside the asteroid characteristic curves shown in FIG. 5. In other words, when the applied data writing magnetic fields have a strength corresponding to the region inside the asteroid characteristic curves, the magnetic direction of free magnetic layer VL does not change.

As is shown by the asteroid characteristic curves, applying a magnetic field in HA direction onto free magnetic layer VL makes it possible to decrease a magnetic threshold necessary to change the magnetic direction which is along EA. When the operating point of data writing is designed as shown in FIG. 5, the magnetic field of data writing in EA direction is so designed to have intensity $H_{WR}$ in tunneling magneto-resistance elements TMR as the data writing target. In other words, the value of the data writing current flown to bit line BL or digit line DL is so designed as to obtain the magnetic field of data writing $H_{WR}$. In general, the magnetic field of data writing $H_{WR}$ is expressed by the sum of switching magnetic field $H_{SW}$ necessary for the switching of the magnetic direction and margin $\Delta H$. In short, $H_{WR}=H_{SW}+\Delta H$.

Rewriting storage data of tunneling magneto-resistance elements TMR, that is, the magnetic direction of tunneling magneto-resistance elements TMR needs to supply both digit line DL and bit line BL with data writing currents higher than the predetermined level. This makes free magnetic layer VL in tunneling magneto-resistance element TMR be magnetized in the direction parallel or opposite to the fixed magnetic layer FL according to the magnetic direction of data writing along EA. The magnetic direction once written in tunneling magneto-resistance elements TMR, that is, storage data in tunneling magneto-resistance elements TMR is held in a nonvolatile manner until new data writing is performed.

With reference to FIG. 3 again, bit line driver WWRa includes transistors 111 and 112 and AND circuits 113 and 114. Transistor 111 is disposed between a power supply voltage Vcc and the other end side of bit line SBL, and has a gate electrically coupled to the output node of AND circuit 113. Transistor 112 is disposed between the other end side of bit line SBL and a ground voltage GND, and has a gate electrically coupled to the output node of AND circuit 114. AND circuit 113 outputs the results of AND logical operation to the gate of transistor 111 according to the inputs of a writing control signal WDTa and control signal WE outputted from control circuit 1. AND circuit 114 outputs the results of AND logical operation to the gate of transistor 112 according to the inputs of a writing control signal WDTb and control signal WE.

Bit line driver WWRb includes transistors 115 and 116 and AND circuits 117 and 118. Transistor 115 is disposed between power supply voltage Vcc and one end of bit line SBL, and has a gate electrically coupled to the output node of AND circuit 117. Transistor 116 is disposed between a ground voltage GND and one end of bit line SBL, and has a gate electrically coupled to the output node of AND circuit 118. AND circuit 117 outputs the results of AND logical operation to the gate of transistor 115 according to the inputs of a writing control signal WDTb and control signal WE. AND circuit 118 outputs the results of AND logical operation to the gate of transistor 116 according to the inputs of writing control signal WDTa and control signal WE. As transistors 111, 112, 115 and 116, N-channel MOS transistors are employed as an example.

For example, when writing control signal WDTa is set at "H" level and control signal WE is also set at "H" level, bit line driver WWRa turns on transistor 111 to electrically couple power supply voltage Vcc to the other end side of bit line SBL. On the other hand, bit line driver WWRb turns on transistor 116 to electrically couple ground voltage GND to one end side of bit line SBL. This results in the formation of a current path from the other end side of bit line SBL to one end side, thereby flowing a data writing current −Iw. When writing control signal WDTb is set at "H" level, a current path is formed from one end side of bit line SBL to the other end side, thereby flowing a data writing current +Iw.

Program section MU1 includes: an equalizing circuit 130 which electrically couples a connection node N4 of tunneling magneto-resistance element TMRa connected to bit line SBL with connection node N3 of tunneling magneto-resistance element TMRb and equalizes them; and transistors SGa and SGb, which function as access elements, for electrically coupling latch unit 100 to tunneling magneto-resistance elements TMRa and TMRb of program section MU1, respectively, in response to control signal SEL1.

Equalizing circuit 130 includes an OR circuit 110, a transfer gate 108 and an inverter 109. Transfer gate 108 is disposed between node N3 and node N4 to electrically couple nodes N3 and N4 to each other upon receipt of the output signal of the OR circuit via OR circuit 110 and inverter 109. OR circuit 110 outputs the results of OR logical operation to transfer gate 108 and inverter 109 in response to the inputs of a control signal /POR which is a reverse of control signal POR outputted from control circuit 1 and control signal WE. This activates equalizing circuit 130 and electrically connects node N3 and node N4 to each other in response to the input of control signal /POR or control signal WE which is at "H" level. On the other hand, equalizing circuit 130 is inactivated to electrically disconnect nodes N3 and N4 from each other in response to the inputs of control signal /POR and control signal WE which are both at "L" level.

As described above, program sections MU1 to MU4 all have the same configuration, and these program sections MU are electrically coupled to latch unit 100 in response to the corresponding control signals SEL1 to SEL4 outputted from control circuit 1. Control signals SEL1 to SEL4 are commonly used in the other unillustrated data latch circuits PMC.

Latch unit 100 includes: an equalizing circuit 120 which equalizes an output node N0 and an output node N1; and transistors 101 to 104 and 107.

Transistor 107 is disposed between power supply voltage Vcc and a node N2, and has a gate receiving control signal WE. Transistor 101 is disposed between node N2 and node N0, and has a gate electrically coupled to node N1. Transistor 102 is disposed between node N0 and transistor SGb, and has a gate electrically coupled to node N1. Transistor 103 is disposed between node N2 and node N1, and has a gate electrically coupled to node N0. Transistor 104 is disposed between node N1 and transistor SGa, and has a gate electrically coupled to node N0. As an example, transistors 101, 103 and 107 are P-channel MOS transistors, and transistors 102 and 104 are N-channel MOS transistors.

Equalizing circuit 120 includes an inverter 106 and a transfer gate 105, and electrically couples node N0 and node N1 upon receipt of control signal POR. As an example, equalizing circuit 120 is activated in response to the input of control signal POR which is at "H" level to electrically couple nodes N0 and N1 to each other. On the other hand, equalizing circuit 120 is inactivated in response to the input of control signal POR which is at "L" level to electrically disconnect nodes N0 and N1 from each other.

Data latch circuit PMU further includes: a write control unit 140 which generates writing control signals WDTa and WDTb in response to writing data PDIN; a digit line driver band 160 which supplies data writing currents to digit lines DLa and DLb at the time of data writing; gate transistors TRGb and TRGa which transmit data signals PO and /PO outputted respectively from output nodes N0 and N1 of latch unit 100; a selection line CWL which is electrically coupled to the gates of gate transistors TRGa and TRGb; a delay unit IVG which delays control signal POR by a predetermined time interval; and a NAND circuit AD which transits the results of NAND logical operation of the output signal of delay unit IVG and control signal POR as a control signal POR# to selection line CWL.

Control signal POR is used as a reset signal in the internal circuit of the device as necessary. In this embodiment, control circuit 1 includes a so-called power-on reset circuit (not shown). The power-on reset circuit can output control signal POR. To be more specific, as an example, the power-on reset circuit is set at "L" level when power is turned on until the power supply voltage exceeds the predetermined threshold voltage and is set at "H" level when it exceeds the predetermined threshold voltage. After power is turned on, control signal POR is set at "L" level as necessary by control circuit 1. Driver IVG is formed of a plurality of inverters (2 in this embodiment) to generate a signal delayed by the predetermined time interval in response to the input of control signal POR. The present embodiment shows the case where digit line driver band 160 supplies data writing currents to the digit lines of program section MU1 as a representative. However, in the other program sections MU2 to MU4, data writing currents are supplied to the digit lines of the respective program sections MU from digit line driver bands 160 according to the same method.

Figure 6:
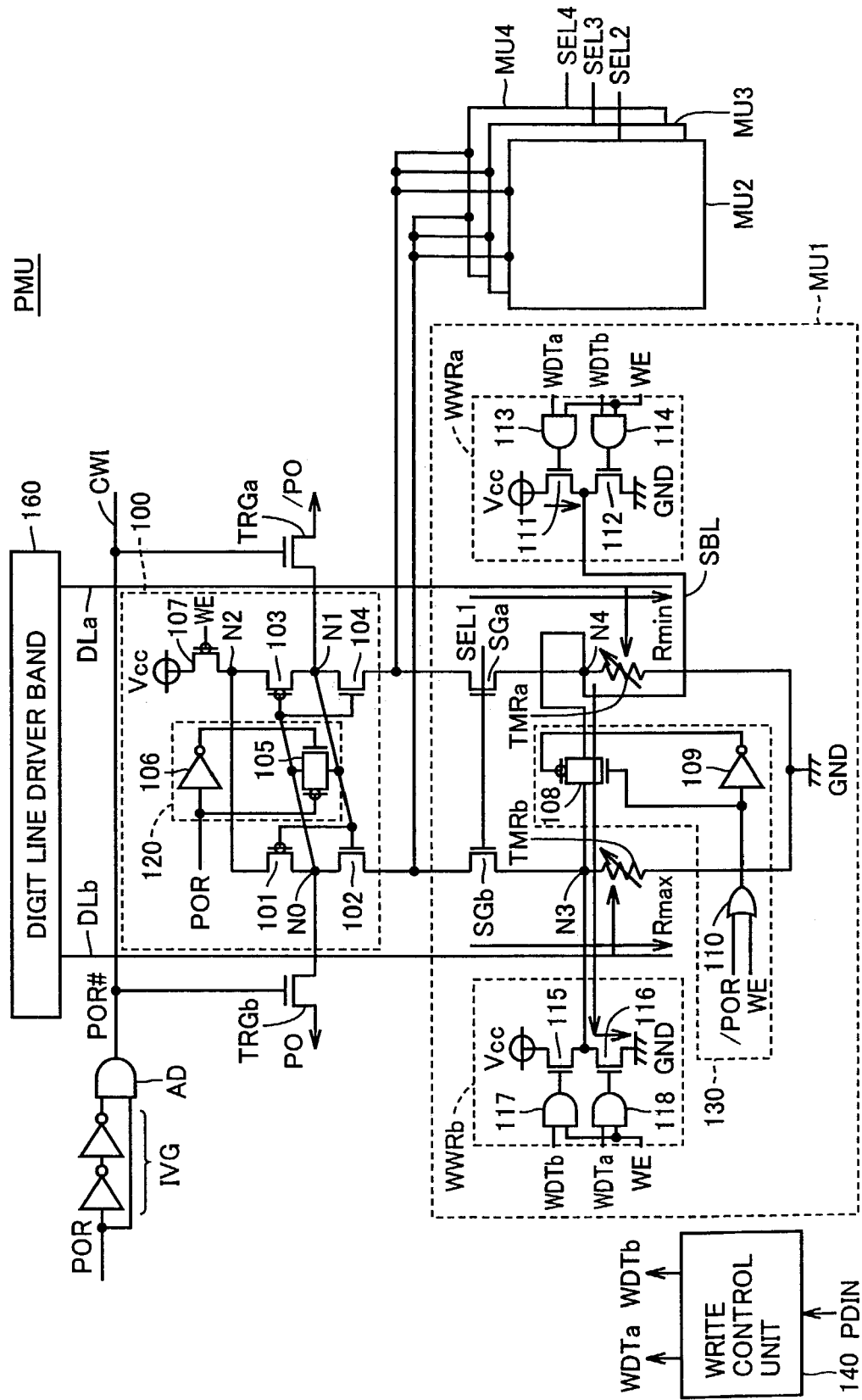
FIG. 6 is a conceptual diagram showing the case where data writing of program data for a program section is performed in a data latch circuit.

Next, description will be given of the case of performing data writing of program data for program section MU1 in data latch circuit PMU, with reference to FIG. 6. This embodiment describes the case of writing program data "0". Assume that control signal WE is set at "H" level at the time of data writing.

Write control unit 140 generates writing control signals WDTa and WDTb according to writing data PDIN. Assume that writing control signals WDTa and WDTb are set at "H" level and "L" level, respectively.

This results in the turning on of transistor 111 in bit line driver WWRa to electrically couple power supply voltage Vcc to the other end side of bit line SBL. Furthermore, transistor 116 is turned on in bit line driver WWRb to electrically couple ground voltage GND to one end side of bit line SBL. Equalizing circuit 130 electrically couples nodes N3 and N4 to each other in response to control signal WE set at "H" level at the time of data writing.

This supplies bit line SBL with data writing current −Iw from one end side to the other end side.

At the same timing, digit line driver band 160 is activated in response to an operational instruction from control circuit 1 to supply data writing currents to digit lines DLa and DLb. According to the data writing currents supplied to bit line SBL and digit lines DLa and DLb, predetermined magnetic fields are applied to tunneling magneto-resistance elements TMRa and TMRb to perform data writing in accordance with the magnetic direction. In the present embodiment, the data writing currents of bit line SBL passing through tunneling magneto-resistance elements TMRa and TMRb are in the direction opposite to each other. Therefore, the electric resistance of tunneling magneto-resistance element TMRa is set at Rmin and the electric resistance of tunneling magneto-resistance element TMRb is set at Rmax. This enables program data ("0") to be stored by using the tunneling magneto-resistance elements of data latch circuit PMU.

Figure 7:
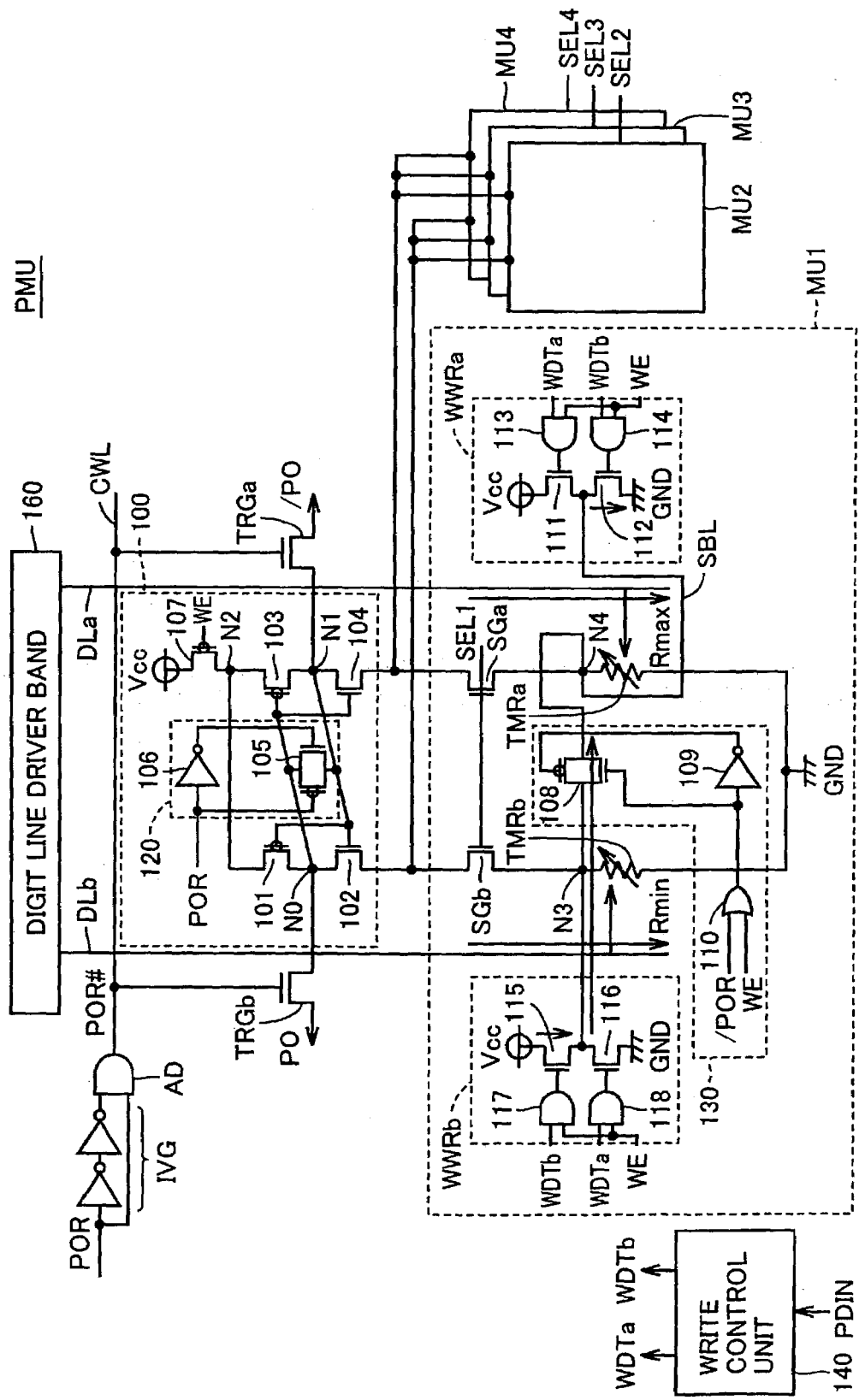
FIG. 7 is a conceptual diagram showing the case where data writing of another program data for the program section is performed in the data latch circuit.

Description will be given of the case of performing data writing of other program data for program section MU1 in data latch circuit PMU, with reference to FIG. 7. The present embodiment describes the case of writing program data ("1"). Assume that control signal WE is set at "H" level at the time of data writing.

Write control unit 140 generates writing control signals WDTa and WDTb in response to writing data PDIN. Assume that writing control signals WDTa and WDTb are set at "L" level and "H" level, respectively.

This results in the turning on of transistor 112 in bit line driver WWRa to electrically couple ground voltage GND to the other end side of bit line SBL. Furthermore, transistor 115 is turned on in bit line driver WWRb to electrically couple power supply voltage Vcc to one end side of bit line SBL. Equalizing circuit 130 electrically couples nodes N3 and N4 to each other in response to control signal WE set at "H" level at the time of data writing. This supplies data writing current +Iw to bit line SBL from one end side to the other end side.

At the same timing, digit line driver band 160 is activated in response to the operational instruction from control circuit 1, thereby supplying data writing currents to digit lines DLa and DLb. According to the data writing currents supplied to bit line SBL and digit lines DLa and DLb, predetermined magnetic fields are applied to tunneling magneto-resistance elements TMRa and TMRb, thereby performing data writing according to the magnetic direction. In the present embodiment, data writing currents of bit line SBL passing through tunneling magneto-resistance elements TMRa and TMRb are in the direction opposite to each other, which sets the electric resistance of tunneling magneto-resistance element TMRa at Rmin and the electric resistance of tunneling magneto-resistance element TMRb at Rmax. This enables program data ("1") to be programmed by using the tunneling magneto-resistance elements of data latch circuit PMU.

Figure 8:
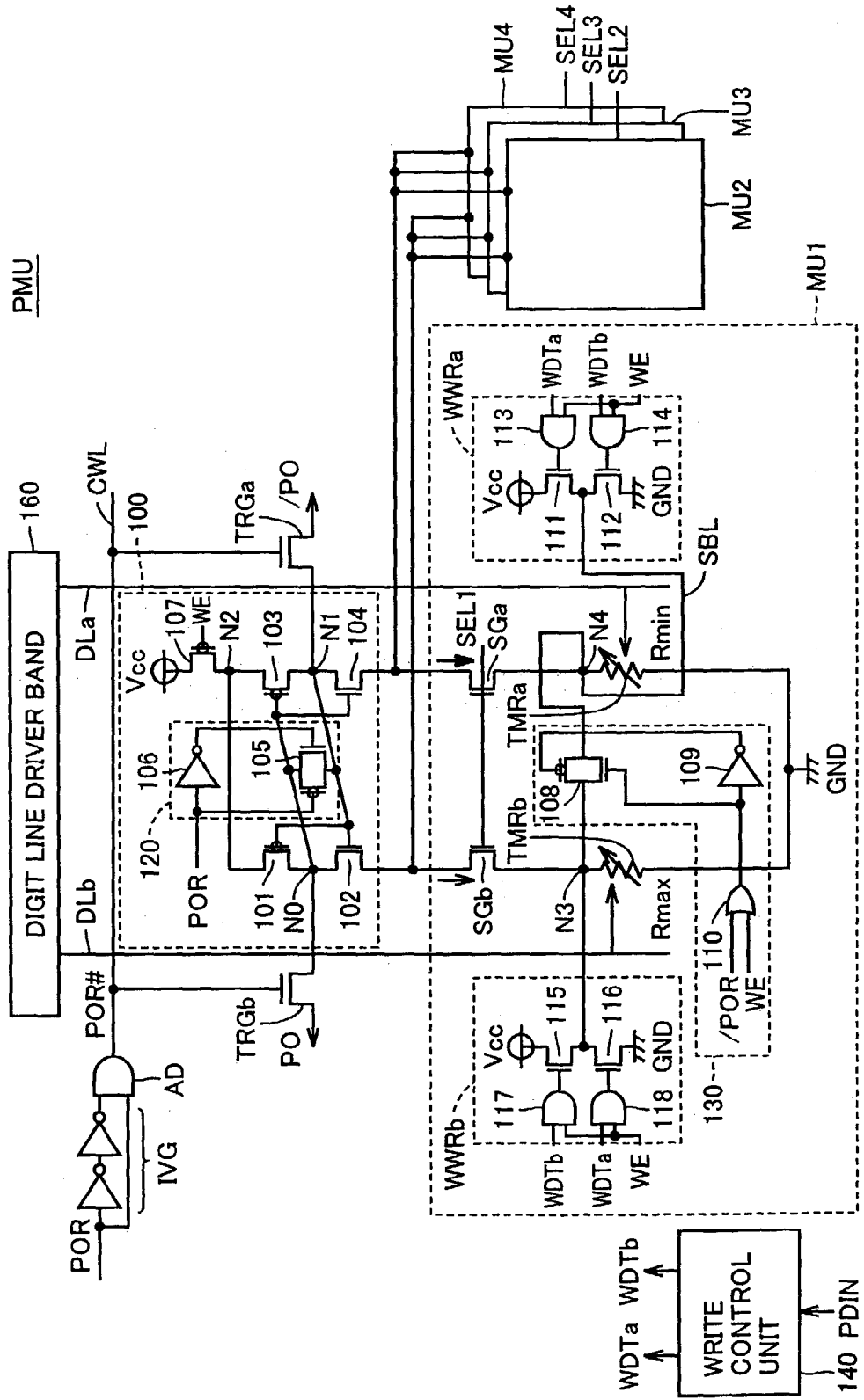

Description will be given of a data reading operation with reference to FIG. 8, to automatically read and latch program data held in program section MU1 in data latch circuit PMU when power is turned on.

This embodiment shows the case where program section MU1 stores program data ("0"), that is, where tunneling magneto-resistance elements TMRa and TMRb are set at electric resistance values Rmin and Rmax, respectively.

With reference to the timing chart of FIG. 9, a data reading operation according to the first embodiment of the present invention performed in data latch circuit PMU shown in FIG. 8 when power is turned on will be described in detail. In this embodiment, the data reading operation is performed without being synchronized with clock signal CLK when power is turned on.

Figure 9:
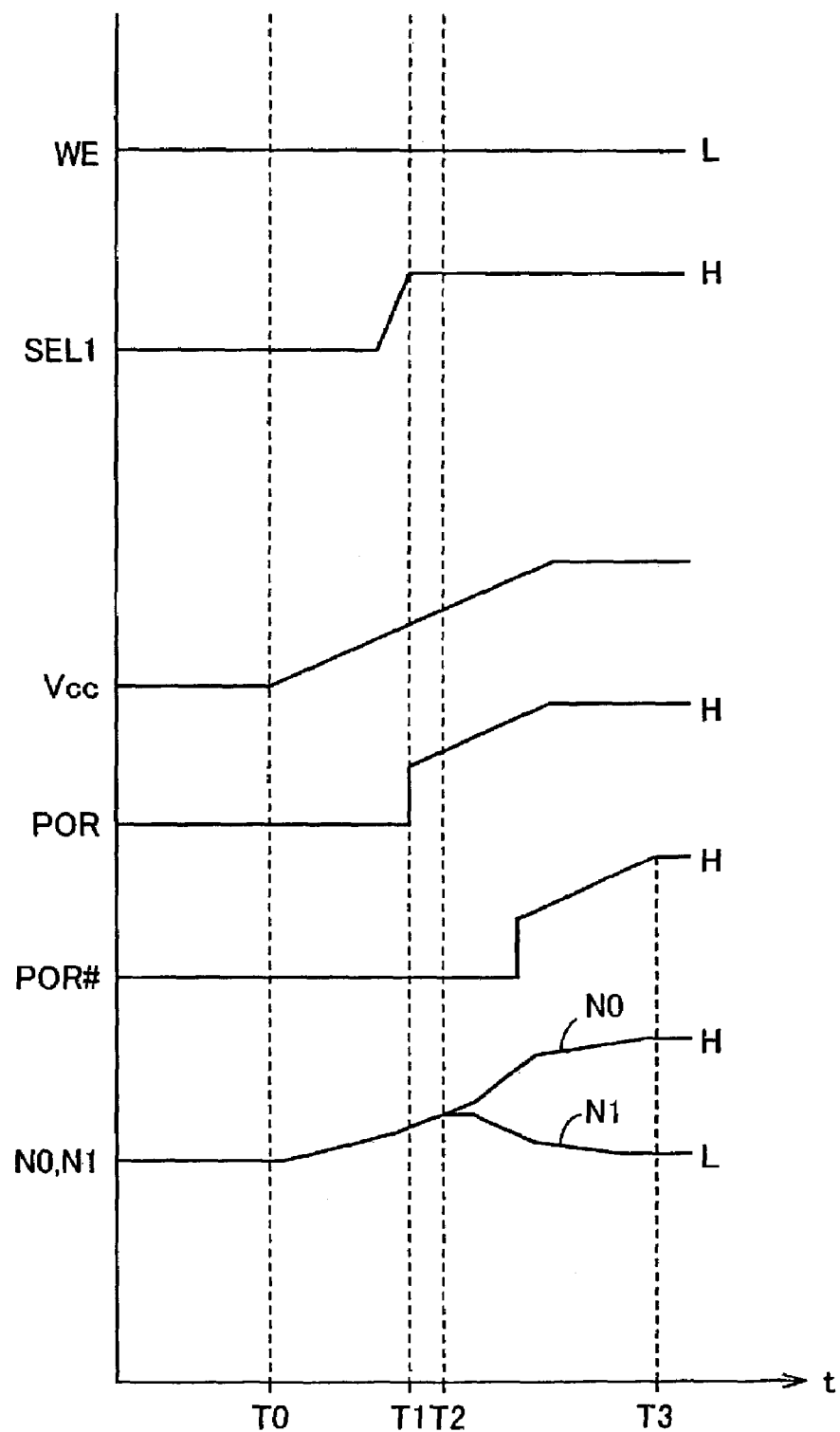
FIG. 9 is a timing chart for specifically describing the data reading operation according to the first embodiment of the present invention.

As shown in FIG. 9, power supply voltage Vcc is applied at time T0 to raise the voltage level of power supply voltage Vcc. At this point of time, power supply voltage Vcc is not more than the predetermined threshold voltage level, and control signal POR is set at "L" level. Consequently, equalizing circuit 120 electrically connects nodes N0 and N1 to each other in response to control signal POR ("L" level) to equalize the output node of latch unit 100. Equalizing circuit 130 electrically connects nodes N3 and N4 to each other in order to equalize them in response to control signal/POR ("H" level). Assume that control signal WE is set at "L" level when power is turned on. This makes latch unit 100 be activated in response to control signal WE ("L" level) and node N2 be supplied with power supply voltage Vcc, thereby starting to charge nodes N0 and N1.

At time T1 after power is turned on, power supply voltage Vcc reaches the predetermined threshold voltage level, and control signal POR starts to make a transition from "L" level to "H" level as described above. In response to this, equalizing circuits 120 and 130 finish equalization. At the same timing, control signal SEL1 is activated (set at "H" level) by control circuit 1.

This results in the turning on of transistors SGa and SGb, which are access elements, to electrically couple tunneling magneto-resistance elements TMRa and TMRb to latch unit 100. To be more specific, transistors 101 and 102 which are connected in series and tunneling magneto-resistance element TMRb are electrically connected in series. Similarly, transistors 103 and 104 which are connected in series and tunneling magneto-resistance element TMRa are electrically connected in series. This forms a current path which flows a current from node N2 supplied with power supply voltage Vcc to ground voltage GND via tunneling magneto-resistance elements TMRa and TMRb. In other words, operating currents according to the electric resistances are supplied from latch unit 100 to tunneling magneto-resistance elements TMRa and TMRb.

At time T2, nodes N0 and N1 have a potential difference in accordance with the difference in passing currents between tunneling magneto-resistance elements TMRa and TMRb. The potential difference is further amplified by latch unit 100 to set the voltage level of output node N0 at "H" level and the voltage level of output node N1 at "L" level. This makes latch unit 100 latch program data.

At time T3 when output nodes N0 and N1 have sufficiently stable voltage levels, gate transistors TRGa and TRGb are turned on, based on control signal POR#, and data signals PO and/PO are outputted outside as program data. To be more specific, data signal PO at "H" level is transmitted to transistors PTR.

In this manner, the program data previously stored in program section MU1 of data latch circuit PMU can be latched and outputted as well as amplified by latch unit 100. In accordance with control signal POR activated to a high level when the predetermined period has passed after power-up, program data are automatically transmitted to transistors PTR. Therefore, for example, when program section MU1 holds program data to perform the connection control of FPGA in the initial condition, program section MU1 can be used to easily perform the connection control of FPGA in the initial condition. In other words, in such a case where a program is hung up in the middle, program data for basic operations can be decoded by using control signal POR which resets the system. This makes it possible to reset to the initial condition, thereby improving the fail-safe approach and stability of the system.

When it is desired to change the functions of the FPGA, program section MU holding other program data is used to perform the connection control of switch section CON. Although program section MU1 is described as a program section to perform the connection control in the initial condition in this embodiment, other program sections MU can be used instead.

This embodiment shows the case where program sections MU1 to MU4 are included in one data latch circuit PMU, and control signals SEL1 to SEL4 can be selectively activated to perform four patterns of switching control. The number of program sections MU has no limitation, and a plurality of program sections MU can be provided to increase the variations of the switching control.

The provision of the plurality of program sections in data latch circuit PMU and the previous storage of program data to be used for the connection control in each program section can perform efficient changing of the functions of the FPGA.

Figure 10:
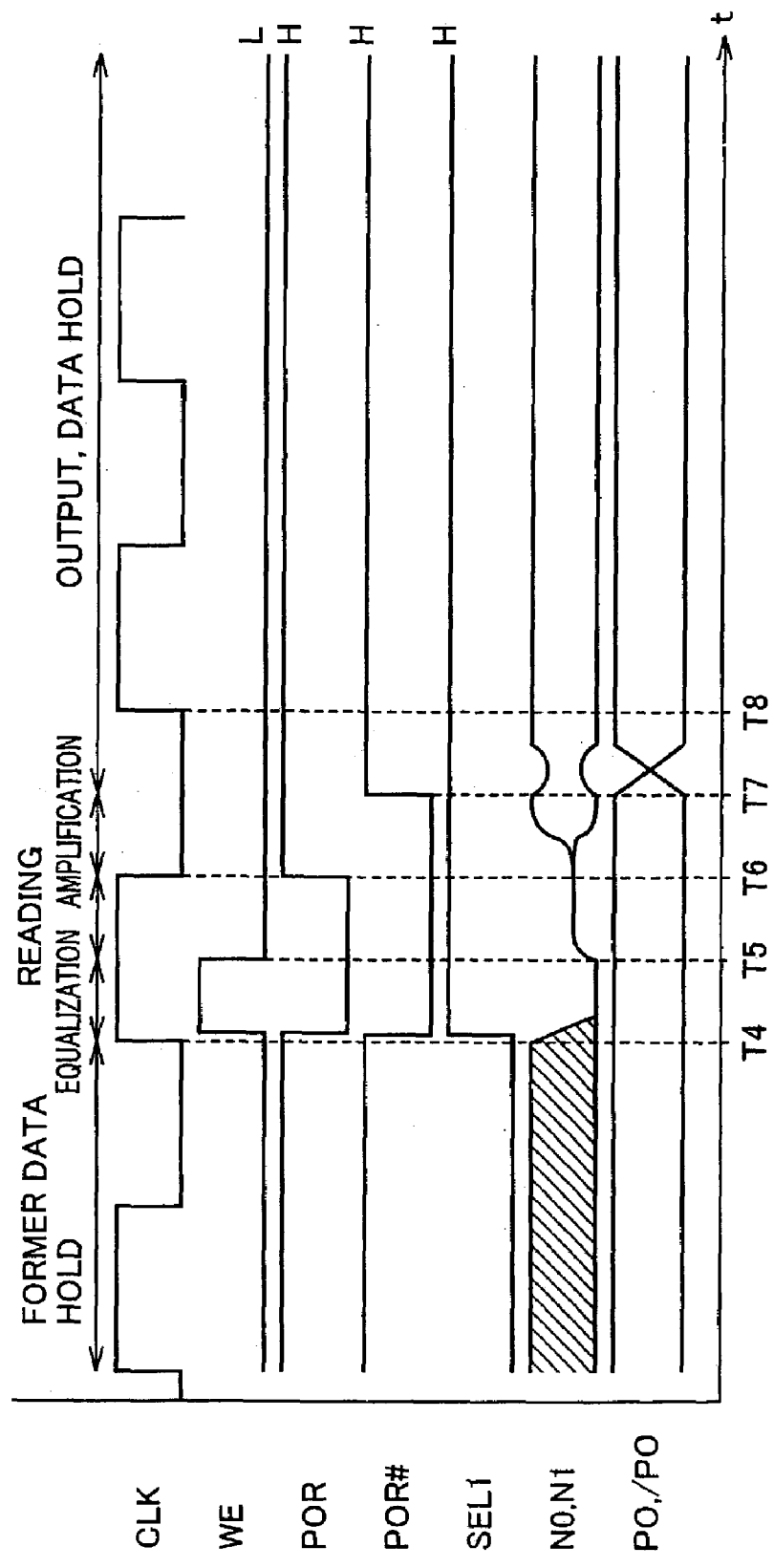
FIG. 10 is a timing chart describing the data reading operation of the data latch circuit according to the first embodiment of the present invention at the time of changing the functions of the FPGA.

The following is a description of the data reading operation of data latch circuits PMU in the first embodiment of the present invention in changing the functions of the FPGA, with reference to the timing chart of FIG. 10. In short, the following describes the case where a data reading operation is performed in synchronization with clock signal CLK after power is turned on.

At approximately the same timing as time T4 which is synchronized with the rising edge of clock signal CLK, control circuit 1 sets control signal POR at "L" level. It also sets control signal WE at "H" level. As a result, nodes N0 and N1 are electrically coupled and equalized in equalizing circuit 120. In equalizing circuit 130 nodes N3 and N4 are electrically connected and equalized in response to control signal /POR ("H" level) which is a reverse signal of control signal POR. This erases (equalizes) data latched before (data hold). Thus, using equalizing circuits can facilitate to clear latched data.

At time T4 which is the same timing, control signal SEL1 is set at "H" level. As a result, latch unit 100 and program section MU1 are coupled electrically.

In response to the falling edge ("L" level) of control signal WE at time T5, transistor 107 of latch unit 100 is turned on. This results in the formation of a current path (lead) from power supply voltage Vcc to ground voltage GND via tunneling magneto-resistance elements TMRa and TMRb.

At time T6 which is synchronized with the falling edge of clock signal CLK, control signal POR is set at "H" level. This terminates the equalization of nodes N0 and N1 in equalizing circuit 120. Also, nodes N3 and N4 in equalizing circuit 130 finish equalization. Consequently, a current difference according to the resistance difference between tunneling magneto-resistance elements TMRa and TMRb is amplified as a voltage difference and generated in nodes N0 and N1.

At time T7 when the predetermined period has passed after the rising edge of control signal POR, control signal POR# is raised to a high level. This makes gate transistors TRGa and TRGb be turned on, based on control signal POR# ("H" level), and outputs data signals PO and/PO outside as program data.

At time T8 when next clock signal CLK rises, latched data signal PO (data hold) is outputted stably. This makes it possible to change the functions of the FPGA on the basis of data signal PO outputted.

This embodiment has described the data reading operation where program data stored in program section MU is equalized, read, amplified and outputted within one clock cycle at the time of changing the functions of the FPGA.

The following is a description of the case where a data reading operation is performed to change the functions in synchronization with a high-frequency clock signal CLK# (hereinafter simply referred to as clock signal CLK#).

Figure 11:
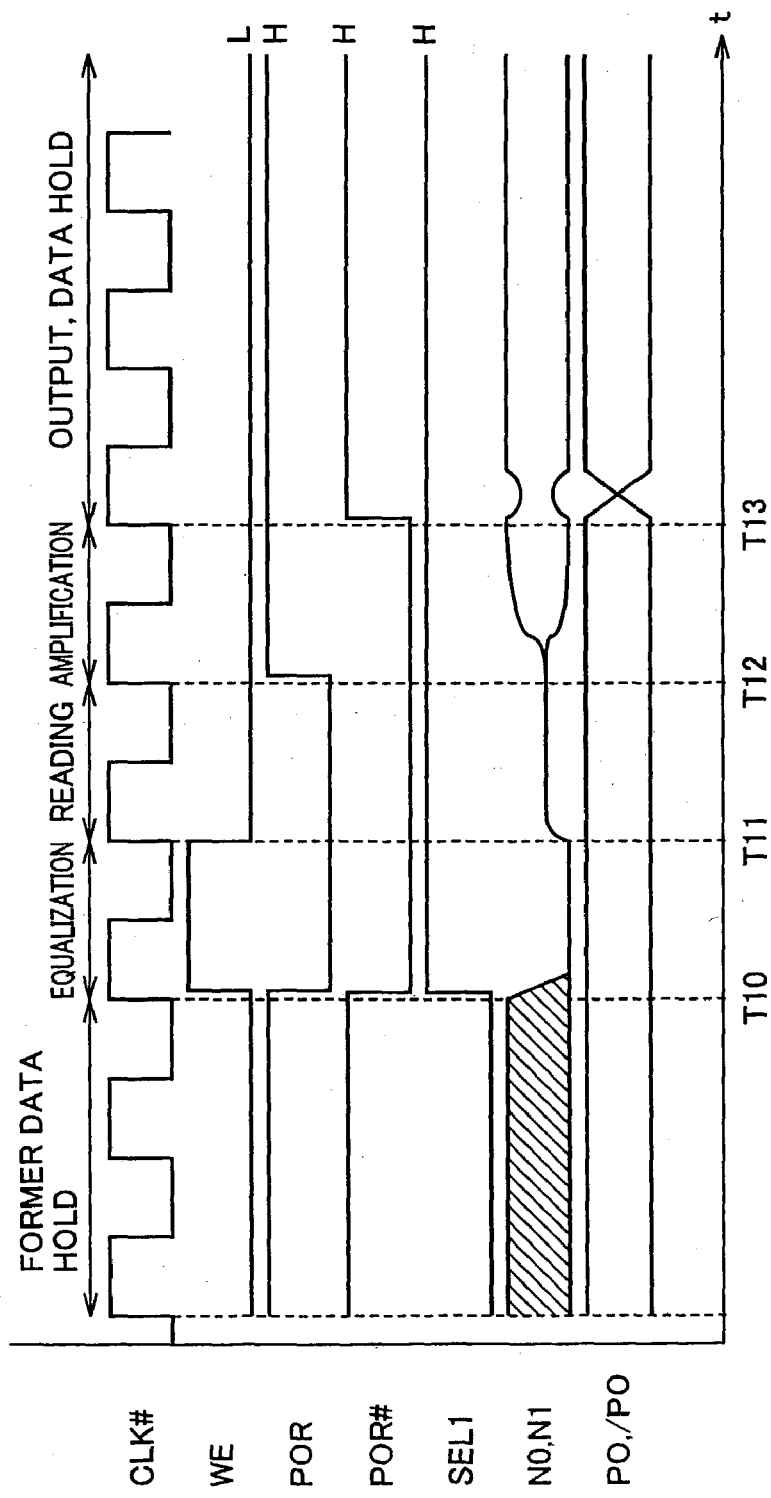
FIG. 11 is a timing chart for describing the data reading operation when the functions are changed in synchronization with a clock signal in the first embodiment.

With reference to the timing chart of FIG. 11, a data reading operation to change the functions in synchronization with clock signal CLK# in the first embodiment will be described.

At approximately the same timing as time T10 which is synchronized with the rising edge of clock signal CLK#, control signal POR is set at "L" level. This makes nodes N0 and N1 be electrically coupled and equalized in equalizing circuit 120. In addition, nodes N3 and N4 are electrically coupled and equalized in equalizing circuit 130 in response to control signal /POR ("H" level) which is a reverse signal of control signal POR. As a result, data latched before (data hold) disappears. At the same timing, control signal WE is set at "H" level. This suspends the supply of power supply voltage Vcc from transistor 107.

At time T10 which is the similar timing, control signal SEL1 outputted from control circuit 1 is set at "H" level. This causes latch unit 100 and program section MU1 to be electrically coupled.

At time T11 which synchronizes the rising edge of the next clock signal CLK#, control signal WE is set at "L" level. This turns on transistor 107 in latch unit 100. To be more specific, this results in the formation of a current path (lead) from power supply voltage Vcc to ground voltage GND via tunneling magneto-resistance elements TMRa and TMRb.

At time T12 which is synchronized with the rising edge of clock signal CLK#, control signal POR is set at "H" level. This results in the termination of the equalization of nodes N0 and N1 in equalizing circuit 120. Also, the equalization of nodes N3 and N4 in equalizing circuit 130 is terminated. Consequently, a current difference according to the resistance difference between tunneling magneto-resistance elements TMRa and TMRb is generated in nodes N0 and N1 by being converted into a voltage difference and amplified.

At time T13 which synchronizes the rising edge of clock signal CLK#, control signal POR# is raised to a high level. This turns on gate transistors TRGa and TRGb based on control signal POR# ("H" level), and outputs data signals PO and/PO outside as program data.

In a high-frequency clock signal (such as 1 GHz), it is difficult to perform a data reading operation within one clock cycle period shown in FIG. 10, however, outputting control signals WE, POR, POR# and SEL1 at the timing in synchronization with clock signal CLK# as in this embodiment makes it possible to perform a high-speed and efficient data reading operation. This realizes switching of the functions of the FPGA at a minimum latency.

Using tunneling magneto-resistance elements TMR and the like as storage elements in which to store program data used to change the functions of the FPGA realizes the connection control of limitless function-switching operations of the system, without considering the limitation the number of times of rewriting as in flash memory (R).

First Modification of First Embodiment

The first embodiment has described the case where in data latch circuit PMU, tunneling magneto-resistance elements TMRa and TMRb are supplied with data writing currents so as to store program data in program sections MU according to the magnetic direction of the tunneling magneto-resistance elements.

A first modification of the first embodiment of the present invention will describe the case where in data latch circuit PMU, fixed program data is stored in program sections MU.

Figure 12:
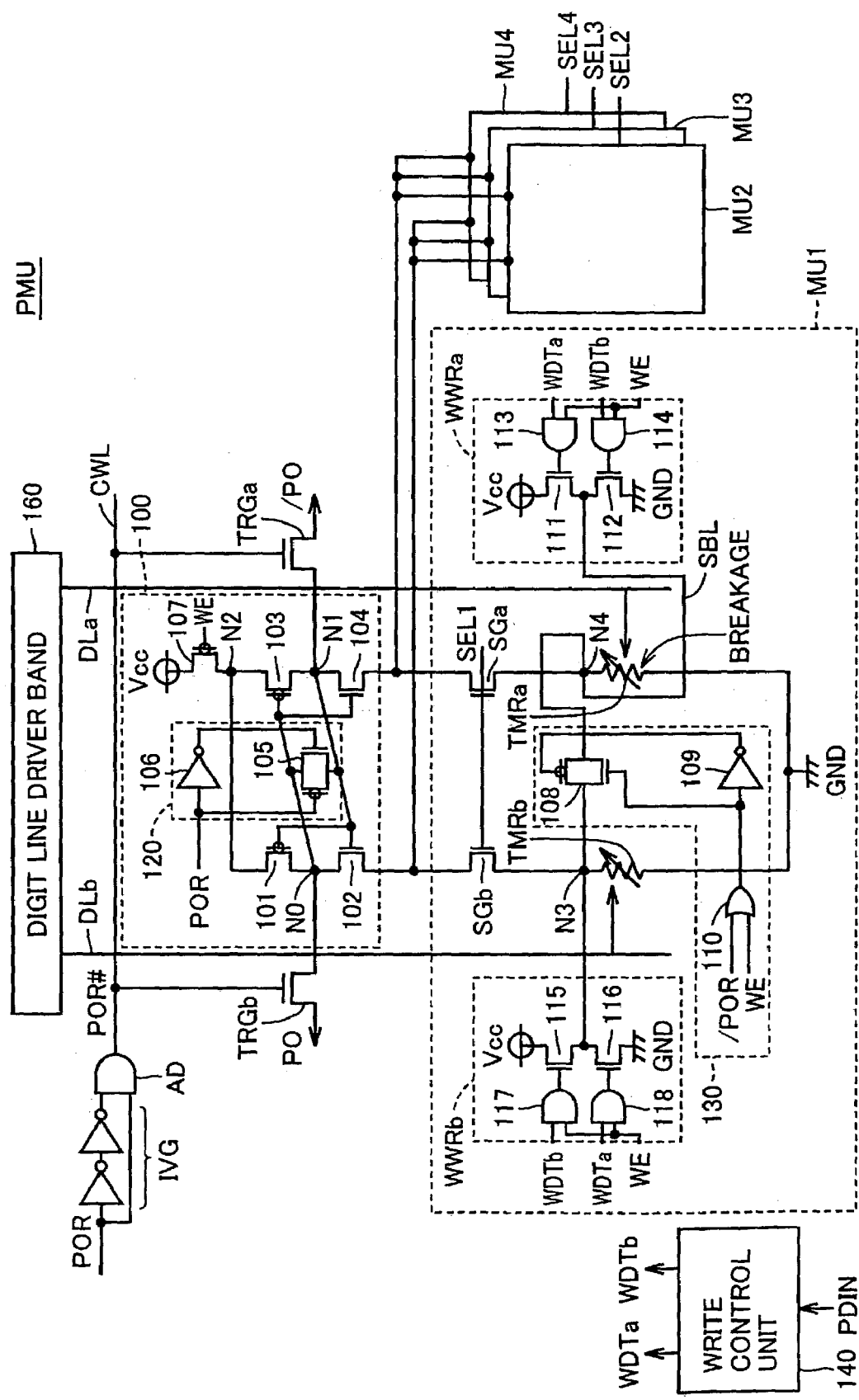
FIG. 12 is a circuit diagram for describing data writing in a data latch circuit according to a first modification of the first embodiment.

The following is a description of data writing in data latch circuits PMU according to the first modification of the first embodiment, with reference to FIG. 12.

Data latch circuits PMU of the first modification of the first embodiment have a similar circuit configuration to that of data latch circuits PMU of the first embodiment shown in FIG. 3, so their detailed description will not be repeated.

The present embodiment has an objective of storing program data fixedly by breaking tunneling magneto-resistance elements TMR.

To be more specific, a high voltage is applied on tunneling magneto-resistance elements TMR. That is, nodes N3 and N4 are electrically disconnected in equalizing circuit 130 at the time of data writing. This results in the exclusive formation of a current path which flows a current from a writing driver to tunneling magneto-resistance element TMRa or TMRb, instead of the formation of a current path between writing driver WWRa and writing driver WWRb or between writing driver WWRb and writing driver WWRa at the time of data writing.

To be more specific, at the time of data writing described above, control signal WE is kept at "L" level. Write control unit 140 sets one of writing control signals WDTa and WDTb at "H" level in response to writing data PDIN. As a result, tunneling magneto-resistance element TMRa or TMRb is applied with a high voltage and its thin film magnetic material is broken. The electric resistance value of the broken tunneling magneto-resistance element is fixedly set at Rmin# (<Rmin) smaller than Rmin.

As an example, when writing control signal WDTa at "H" level is inputted to writing drivers WWRa and WWRb, tunneling magneto-resistance element TMRa is broken. On the other hand, when writing control signal WDTb at "H" level is inputted to writing drivers WWRa and WWRb, tunneling magneto-resistance element TMRb is broken.

Therefore, breaking either one of tunneling magneto-resistance elements TMRa and TMRb can store program data fixedly in program sections MU.

Based on the difference in electric resistances between the broken tunneling magneto-resistance element TMR (having a smaller resistance value) and the unbroken tunneling magneto-resistance element TMR (having a larger resistance value), a data reading operation similar to the data reading operation based on the resistance difference between resistances Rmax and Rmin described in the first embodiment can be performed.

According to this system, fixed storage of desired program data can be done stably without causing program data stored in program sections MU to be rewritten by the influence of magnetic noises and the like.

Second Modification of First Embodiment

A second modification of the first embodiment will describe the configuration of data latch circuits PMU# in which the electric connection between program sections MU and the latch unit has been changed.

Figure 13:
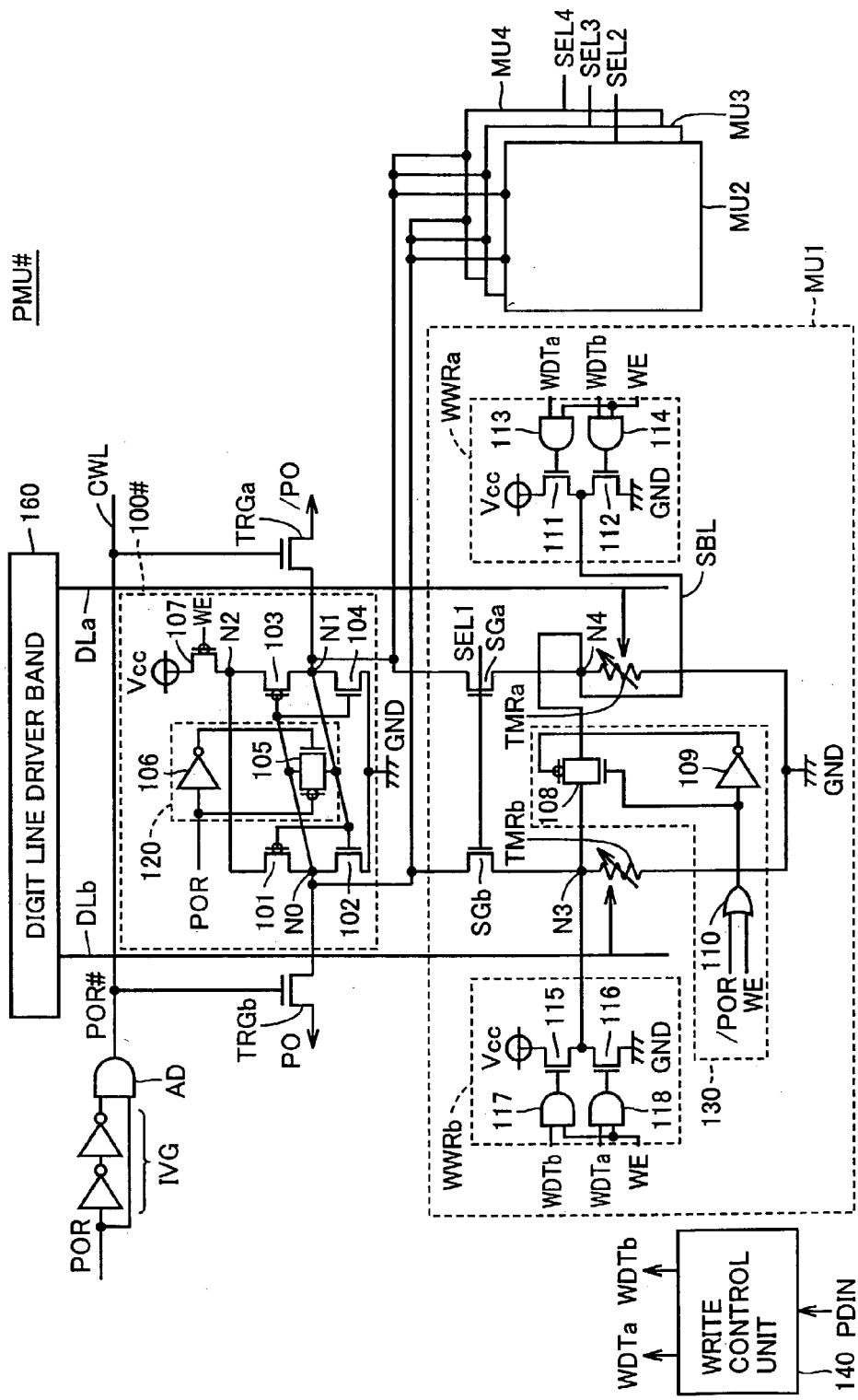
FIG. 13 is a circuit diagram of a data latch circuit according to a second modification of the first embodiment.

In FIG. 13, data latch circuit PMU# according to the second modification of the first embodiment differs from data latch circuit PMU shown in FIG. 3 in that latch unit 100# is substituted for latch unit 100, and that output nodes N0 and N1 of latch unit 100# are electrically connected with program sections MU1–MU4. Since the other respects are the same, the detailed description will not be repeated.

Latch unit 100# differs from latch unit 100 in that transistors 102 and 104 are disposed between node N0 and ground voltage GND and between node N1 and ground voltage GND, respectively. Since the other respects are the same, the detailed description will not be repeated.

Latch unit 100# corresponds to a so-called cross latch circuit, and supplies operating currents according to the voltage levels of output nodes N0 and N1 so as to amplify the voltage levels of the output nodes to latch.

The data reading operation and the data writing operation are the same as those described in the first embodiment, and their description will not be repeated.

Second Embodiment

As described above, data latch circuits PMU each include a plurality of program sections MU and can change the functions of the FPGA efficiently based on a plurality of patterns. If it is possible to select a program section MU effective at changing functions out of the plurality of program sections according to the system condition, then it could improve the efficiency of management of the system.

In a second embodiment of the present invention, description will be given of data latch circuits PMUa which are disposed in the predetermined region together with data latch circuits PMU according to the first embodiment, and which output a determining signal PS indicative of an effective program section MU out of the plurality of program sections MU that data latch circuits PMU each have.

Figure 14:
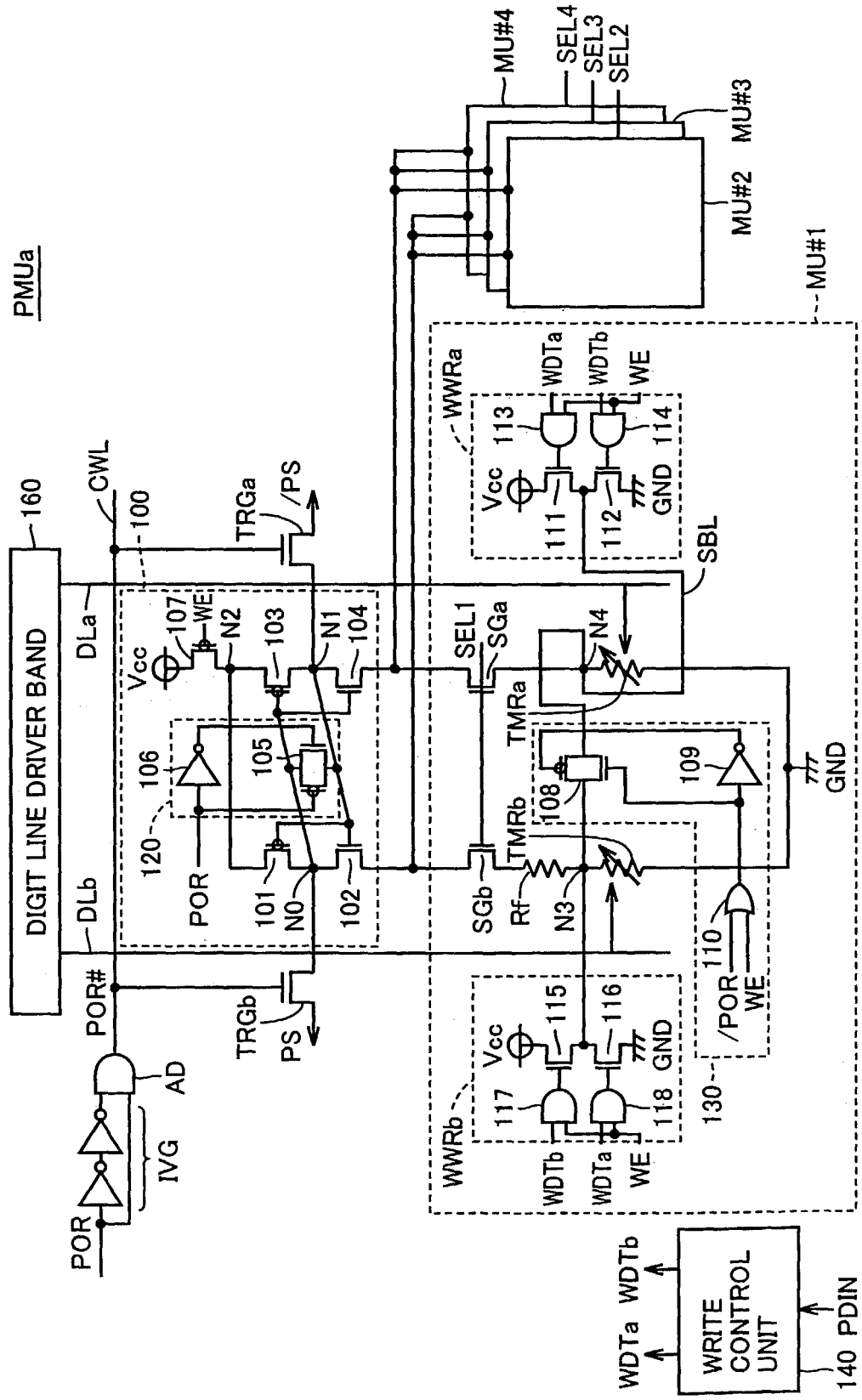
FIG. 14 is a circuit diagram of a data latch circuit according to a second embodiment of the present invention.

With reference to FIG. 14, data latch circuit PMUa according to the second embodiment differs from data latch circuit PMU in that program sections MU#1 to MU#4 are substituted for program sections MU1 to MU4. Since the other respects are the same, the detailed description will not be repeated. Program sections MU#1 to MU#4 all have the same configuration, the configuration of program section MU#1 will be representatively described. Latch unit 100 outputs program data stored in program sections MU#1 to MU#4 as determining signals PS and/PS.

Program section MU#1 differs from program section MU1 in that a fixed resistance Rf is disposed between transistor SGb and node N3. Since the other respects are the same, the detailed description will not be repeated.

In program section MU#1, fixed resistance Rf is designed to have a value between electric resistance values Rmax and Rmin of the tunneling magneto-resistance elements, which is, e.g. an intermediate resistance value Rmid (=(Rmax−Rmin)/2) in the present embodiment.

Figure 15:
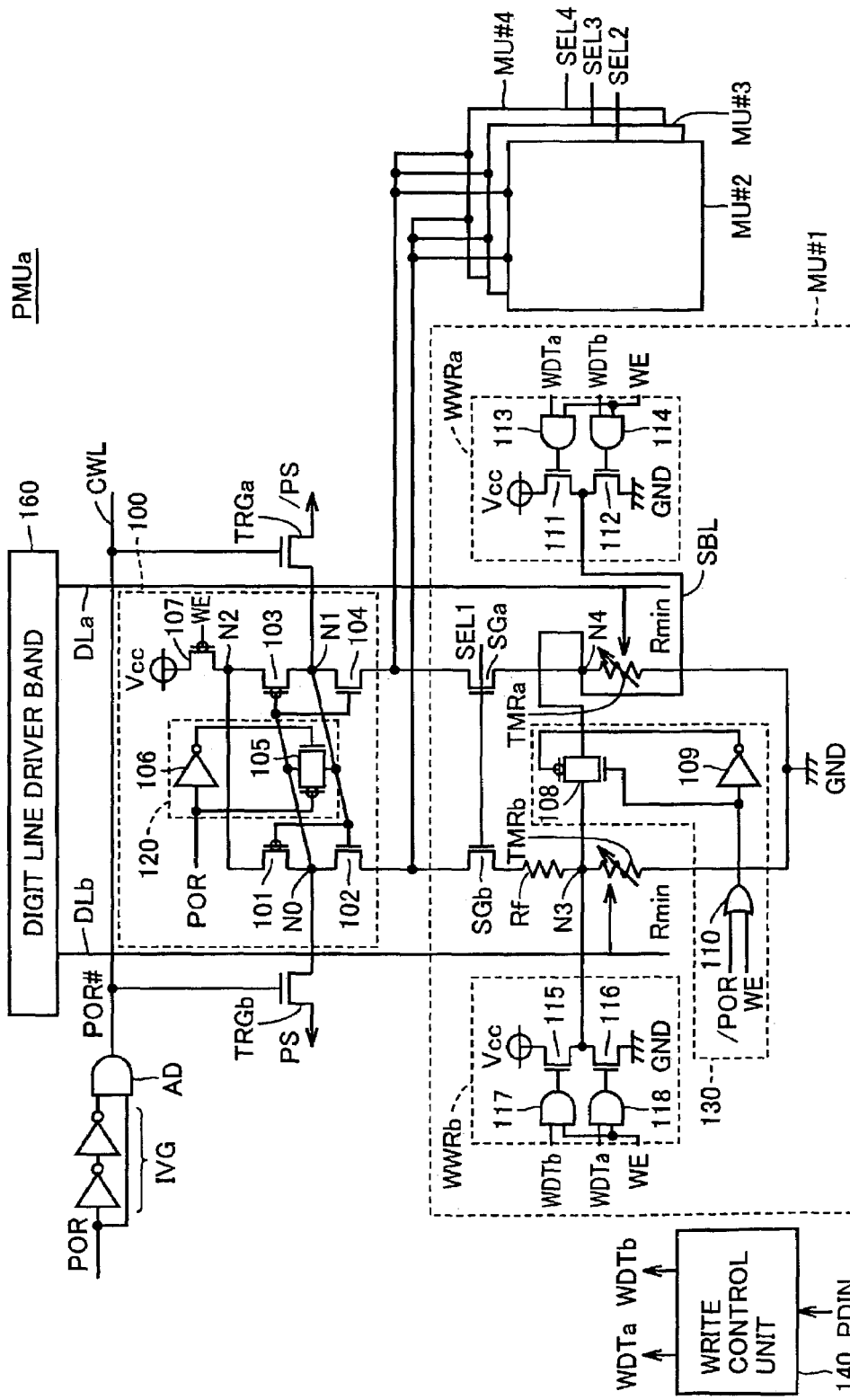
FIG. 15 is a conceptual diagram for describing a data latch circuit in the initial state (data invalidation state)

With reference to FIG. 15, data latch circuit PMUa in the initial condition (data invalidation state) will be described as follows.

Assume that in the initial condition before data writing, tunneling magneto-resistance elements TMRa and TMRb of program section MU#1 are set at electric resistance values Rmin. As a result, the combined resistance value (Rmid+Rmin) of tunneling magneto-resistance element TMRb and fixed resistance Rf is larger than electric resistance value Rmin of tunneling magneto-resistance element TMRa.

Therefore, when the data reading operation described in the first embodiment is performed in this condition, nodes N0 and N1 are latched at "H" level and "L" level, respectively. Thus, in the initial condition, determining signal PS at "H" level is latched and outputted by data latch circuit PMUa. This condition is referred to as the data invalidation state.

Figure 16:
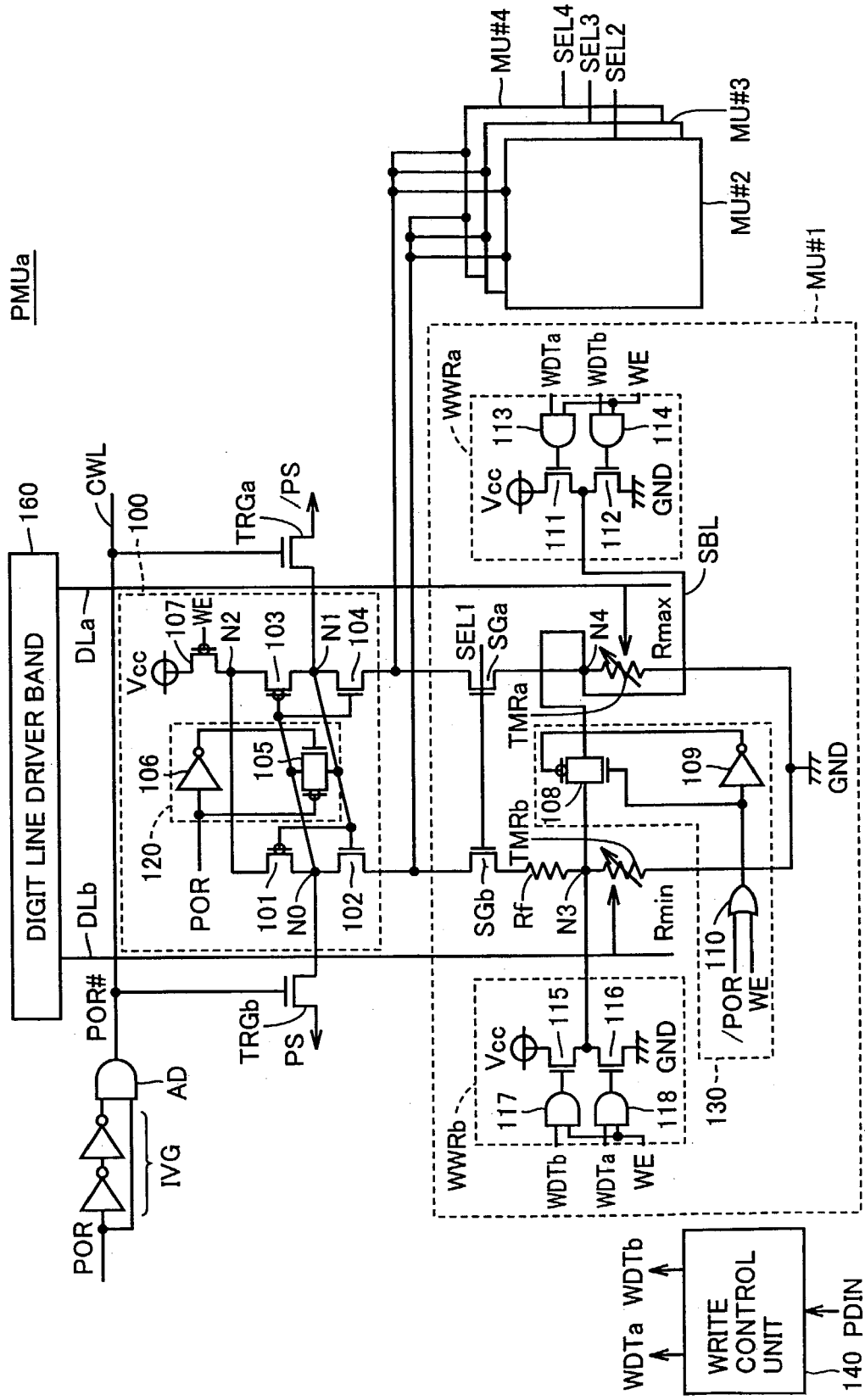
FIG. 16 is a conceptual diagram showing the case where the data latch circuit is set from the data invalidation state to a data validation state.

The following is a description of a transition from the data invalidation state to the data validation state of data latch circuit PMUa, with reference to FIG. 16.

As described in the first embodiment, writing control signal WDTb is set at "H" level in writing control unit 140. This makes bit line SBL be supplied with data writing current +Iw. According to data writing currents flowing through digit lines DLa and DLb, the electric resistance of tunneling magneto-resistance element TMRa makes a transition from Rmin to Rmax. On the other hand, the electric resistance of tunneling magneto-resistance element TMRb is kept at Rmin.

In this case, electric resistance Rmax of tunneling magneto-resistance element TMRa becomes larger than combined resistance value (Rmid+Rmin) of tunneling magneto-resistance element TMRb and fixed resistance Rf.

Therefore, when the data reading operation described in the first embodiment is performed in this condition, node N0 is set at "L" level, and node N1 is set at "H" level and latched. Thus, determining signal PS at "L" level is latched and outputted by data latch circuit PMUa. This condition is referred to as the data validation state.

On the other hand, when the electric resistance of tunneling magneto-resistance element TMRa is made a transition from Rmax to Rmin, the electric resistance of tunneling magneto-resistance element TMRb becomes Rmax, and electric resistance Rmin of tunneling magneto-resistance element TMRa becomes smaller than combined resistance value (Rmax+Rmid) of tunneling magneto-resistance element TMRb and fixed resistance Rf.

Therefore, as described above, determining signal PS at "H" level is latched and outputted by data latch circuit PMUa. In short, the data invalidation state occurs.

Like in the present embodiment, detecting the data level of determining signal PS by control circuit 1 can determine between the data validation state and the data invalidation state, based on which to efficiently select a program section MU indicating the data validation state.

To be more specific, control 1 detects determining signal PS outputted as a result of the execution of data reading operations in program sections MU#1 to MU#4 contained in data latch circuit PMUa. Based on determining signal PS, control signals SEL1 to SEL4 are selectively activated in data latch circuit PMU.

This facilitates the determination of an effective program section MU according to the system conditions, thereby achieving the efficient change of the functions of the FPGA or the efficient management of the system.

As in this configuration, connecting fixed resistance Rf with tunneling magneto-resistance element TMRb in series can set the data level of the initial condition so as to determine between validity and invalidity based on the comparison with the data level in the initial condition, thereby detecting the determining signal with ease.

Also in each data latch circuit PMUa according to the second embodiment, in the same manner as in the second modification of the first embodiment, breaking tunneling magneto-resistance elements TMR makes it possible to output the determining signal either in the condition of valid or invalid permanently.

For example, in the present embodiment, breaking tunneling magneto-resistance element TMRb on the fixed resistance Rf side generally makes combined resistance (Rmid+Rmin#) of fixed resistance Rf and tunneling magneto-resistance element TMRb smaller than the electric resistance of tunneling magneto-resistance element TMRa.

Consequently, at the time of data reading, determining signal PS is continuously set at "L" level, exhibiting the data validation state.

Although the present embodiment has described the case where fixed resistance Rf is disposed on the tunneling magneto-resistance element TMRb side, it is possible to dispose fixed resistance Rf on the tunneling magneto-resistance element TMRa side.

The present embodiment differs in that fixed resistance Rf is provided in data latch circuit PMU of the first embodiment, and it is possible to configure data latch circuit PMUa with ease.

The above description deals mainly with the case where the data latch circuits store program data used for the switching control of FPGA, however, besides FPGA, program data used for the operations in other internal circuits can be stored. It is also possible to use the data latch circuits which output a determining signal indicative of the data validation state or data invalid, outside FPGA.

The aforementioned embodiments have described the case where data storage is performed by using tunneling magneto-resistance elements, however, it is also possible to perform data storage by variable resistance elements which have the property of following the phase transition to either one of the crystal condition (low resistance) and the amorphous condition (high resistance) of a thin film material, chalcogenide.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile memory device comprising a data latch circuit for holding and outputting program information used for a peripheral circuit, wherein
    said data latch circuit includes:
    a plurality of program sections each for receiving a data writing current according to corresponding one of program data constituting said program information to perform nonvolatile data storage; and
    a latch circuit for holding a data signal generated by a selected program section among said plurality of program sections at the time of data reading, wherein
    said latch circuit includes:
    a first current supply section for supplying an operating current in accordance with the voltage level of a first holding node to a second holding node; and
    a second current supply section for supplying an operating current in accordance with the voltage level of said second holding node to said first holding node,
    each of said program sections includes first and second storage elements having different electric resistances from each other on the basis of said data writing currents in accordance with said program data,
    at the time of said data reading, said first and second current supply sections connected to a first voltage are electrically coupled in series to said first and second storage elements connected to a second voltage in said selected program section, respectively,
    each of said program sections further includes a resistance element, connected in series to one of said first and second storage elements, having a fixed electric resistance, and
    each of said first and second storage elements has a same resistance value in initial state.

2. A nonvolatile memory device comprising a data latch circuit for holding and outputting program information used for a peripheral circuit, wherein
    said data latch circuit includes:
    a plurality of program sections each for receiving a data writing current according to corresponding one of program data constituting said program information to perform nonvolatile data storage; and
    a latch circuit for holding a data signal generated by a selected program section among said plurality of program sections at the time of data reading, wherein
    said latch circuit includes:
    a first current supply section, disposed between a first voltage and a second voltage, for supplying an operating current according to the voltage level of a first holding node to a second holding node; and
    a second current supply section, disposed between said first voltage and said second voltage, for supplying an operating current according to the voltage level of said second holding node to said first holding node,
    each of said program sections includes first and second storage elements having different current resistances from each other on the basis of said data writing currents according to said program data,
    at the time of said data reading, said first and second storage elements electrically connected to a third voltage, respectively, are electrically coupled to said first holding node and said second holding node, respectively, in said selected program section,
    each of said program sections further includes a resistance element, connected in series to one of said first and second storage elements, having a fixed electric resistance, and
    each of said first and second storage elements has a same resistance value in initial state.

* * * * *